United States Patent
Saito

(10) Patent No.: US 7,477,406 B2
(45) Date of Patent: Jan. 13, 2009

(54) PHOTOMASK EVALUATION METHOD AND MANUFACTURING METHOD OF SEMICONDUCTOR DEVICE

(75) Inventor: Masato Saito, Machida (JP)

(73) Assignee: Kabushiki Kaisha Toshiba, Tokyo (JP)

(*) Notice: Subject to any disclaimer, the term of this patent is extended or adjusted under 35 U.S.C. 154(b) by 25 days.

(21) Appl. No.: 11/826,133

(22) Filed: Jul. 12, 2007

(65) Prior Publication Data
US 2008/0049225 A1    Feb. 28, 2008

(30) Foreign Application Priority Data
Jul. 13, 2006  (JP) .............................. 2006-193132

(51) Int. Cl.
*G01B 11/14* (2006.01)
(52) U.S. Cl. ..................................... 356/625; 356/601
(58) Field of Classification Search ................ 356/601, 356/625
See application file for complete search history.

(56) References Cited

U.S. PATENT DOCUMENTS
7,030,966 B2 *   4/2006   Hansen ........................ 355/67

FOREIGN PATENT DOCUMENTS
JP   2002-243428   8/2002
JP   2006-38779    2/2006

\* cited by examiner

*Primary Examiner*—Roy M Punnoose
(74) *Attorney, Agent, or Firm*—Finnegan, Henderson, Farabow, Garrett & Dunner, L.L.P.

(57) ABSTRACT

A photomask evaluation method includes applying energy waves to a photomask having a to-be-measured pattern, detecting a response wave from the photomask, acquiring an edge profile of the to-be-measured pattern based on the response wave, acquiring dimension of that portion of the to-be-measured pattern which lies in a preset area, based on the edge profile, subjecting that portion of the edge profile which lies in the preset area to frequency analysis to acquire intensity distribution of frequency components, and extracting a portion with a frequency lower than a preset frequency from the intensity distribution.

12 Claims, 3 Drawing Sheets

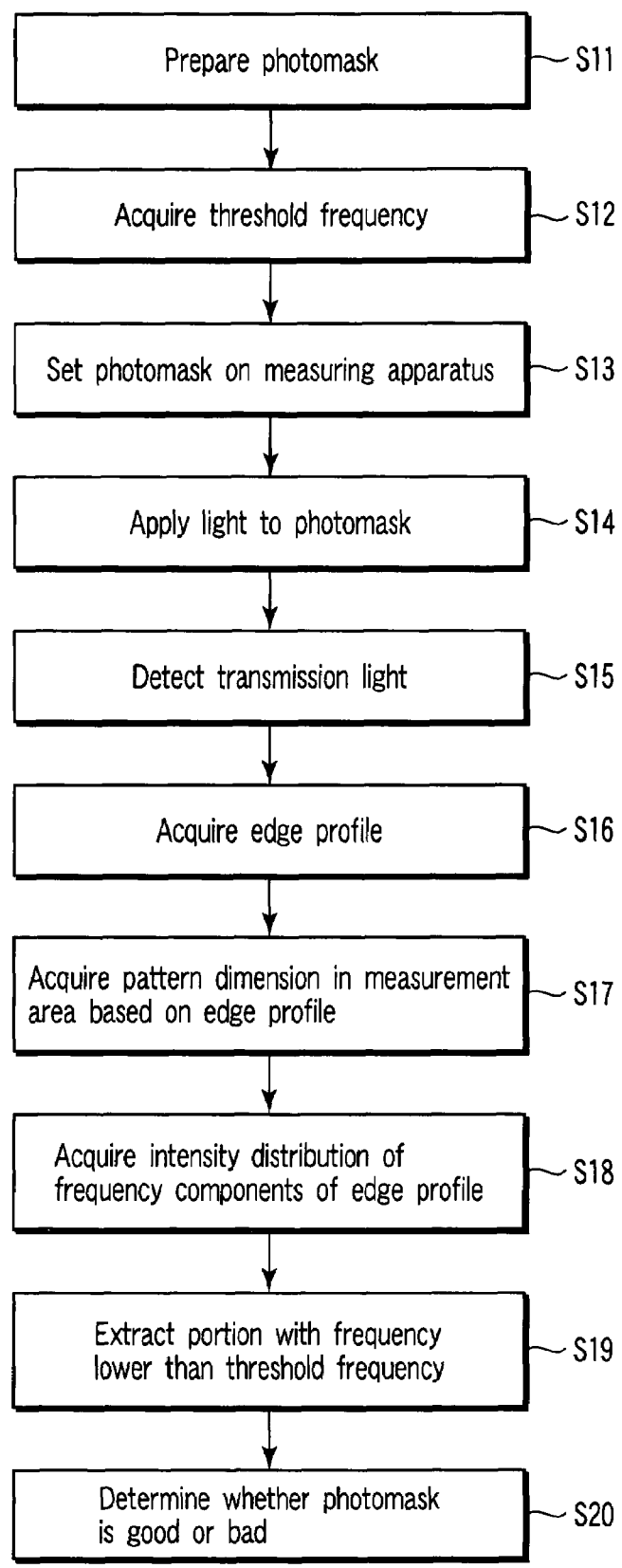
F I G. 1

PHOTOMASK EVALUATION METHOD AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2006-193132, filed Jul. 13, 2006, the entire contents of which are incorporated herein by reference.

BACKGROUND OF THE INVENTION

1. Field of the Invention

This invention relates to a photomask evaluation method and a manufacturing method of a semiconductor device.

2. Description of the Related Art

The operation of adequately evaluating a pattern becomes more important as the pattern in a semiconductor device such as an LSI is further miniaturized (for example, refer to Jpn. Pat. Appln. KOKAI Publication No. 2002-243428).

When a mask pattern formed on a photomask is evaluated, the pattern dimensions are measured in various portions on the photomask and the average value of the pattern dimensions and dispersion (variation) in the pattern dimension are calculated. Specifically, measurement areas called ROI are set in a plurality of portions on the photomask and the pattern dimensions are derived from the edge profiles of the patterns in the ROIs. That is, distances between the edges are calculated based on the edge profiles and the average edge-edge distance in the ROI is set as the pattern dimension.

However, a variation in the dimension caused by the roughness contained in the edge profile exerts a larger influence on the precision of the dimension as the precision of the dimension is more severely required. Various spatial frequency components are contained in the roughness of the pattern edge and frequency components having periods longer than the ROI width (the area width in a direction parallel to the extending direction of the pattern) are present. Therefore, even if the pattern width is originally set constant, the pattern dimension (edge-edge distance) varies according to the edge roughness. That is, the dimension values obtained depending on the ROI width set at the time of measurement vary. As a result, a variation in the pattern dimension in the mask cannot be precisely evaluated.

If the ROI width which is sufficiently larger than the period of the roughness is set, it becomes possible to avoid the above problem. However, when the ROI width is increased, the edge-edge distances in the ROI are averaged. As a result, a variation in the dimension at the spatial frequency having a long period which exerts a bad influence on the device characteristic will be neglected. Therefore, it becomes impossible to adequately evaluate the pattern.

As described above, if the ROI width (measurement area width) is small, there occurs a problem that the pattern dimension cannot be precisely measured and a variation in the pattern dimension in the mask cannot be adequately evaluated. On the other hand, if the ROI width (measurement area width) is large, there occurs a problem that a variation in the dimension at the spatial frequency having a long period which exerts a bad influence on the device characteristic will be neglected and the pattern cannot be adequately evaluated.

BRIEF SUMMARY OF THE INVENTION

An aspect of the present invention, there is provided a photomask evaluation method comprising: applying energy waves to a photomask having a to-be-measured pattern; detecting a response wave from the photomask; acquiring an edge profile of the to-be-measured pattern based on the response wave; acquiring dimension of that portion of the to-be-measured pattern which lies in a preset area, based on the edge profile; subjecting that portion of the edge profile which lies in the preset area to frequency analysis to acquire intensity distribution of frequency components; and extracting a portion with a frequency lower than a preset frequency from the intensity distribution.

BRIEF DESCRIPTION OF THE SEVERAL VIEWS OF THE DRAWING

FIG. 1 is a flowchart for illustrating a method of evaluating a photomask according to an embodiment of the invention.

DETAILED DESCRIPTION OF THE INVENTION

There will now be described an embodiment of this invention with reference to the accompanying drawings.

FIG. 1 is a flowchart for illustrating a method of evaluating a photomask according to an embodiment of this invention. This invention will be explained with reference to the flowchart below.

First, a photomask used as a to-be-evaluated object is prepared (S11). A mask pattern used as a to-be-measured object is formed on the photomask.

Next, a threshold frequency fth of an edge profile of the mask pattern formed on the photomask 11 is acquired by simulation (S12). The threshold frequency fth is explained. As already described before, roughness occurs on the pattern edge of the mask pattern formed on the photomask and various spatial frequency components are contained in the roughness. That is, the roughness having various periods is contained in the pattern edge. When the above mask pattern is transferred onto a wafer by use of a photolithography process, the roughness with the long period (the roughness with the low frequency component) is transferred onto the wafer, but the roughness with the short period (the roughness with the high frequency component) cannot be transferred onto the wafer due to the physical limitation of the photolithography process. That is, the roughness with the short period lying in the mask pattern is not reflected on the pattern on the wafer. In the present embodiment, the boundary frequency between the frequency component of the roughness transferred by the photolithography process and the frequency component of the roughness which is not transferred is set as the threshold frequency fth.

Figure 2:
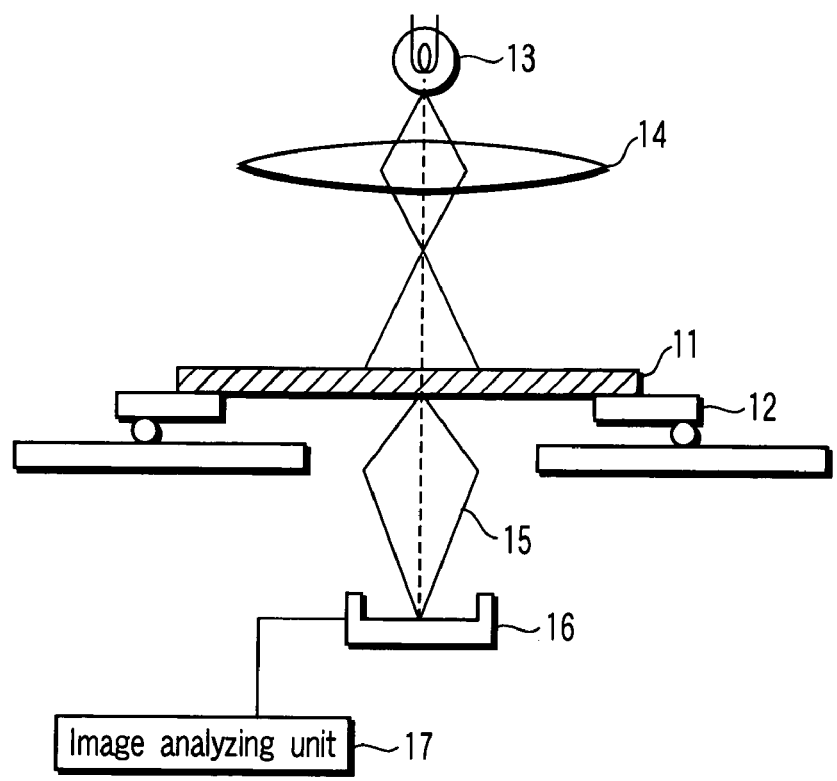
FIG. 2 is a view schematically showing the configuration of a measuring apparatus according to an embodiment of the invention.

Next, the photomask is set on the measuring apparatus (S13). FIG. 2 is a view schematically showing the configuration of the measuring apparatus. The photomask 11 to be evaluated is held on a stage 12. A light source 13 is set above the stage 12 and light from the light source 13 is applied onto the photomask 11 via an illumination optical system 14. Transmission light which has transmitted through a non-light shielding portion of the photomask 11 is made incident on a detector 16 via a detector optical system 15. The detector 16 is connected to an image analyzing unit 17 and a process which will be described later is performed by the image analyzing unit 17.

Then, light (energy waves) from the light source 13 is applied onto the photomask 11 set on the measuring apparatus (S14). Transmission light (response waves) which has transmitted through an area surrounding the mask pattern (light shielding portion) is detected by the detector 16 (S15).

Next, an edge profile of the mask pattern is acquired based on the transmission light detected by the detector 16 by use of the image analyzing unit 17 (S16).

Figure 3:
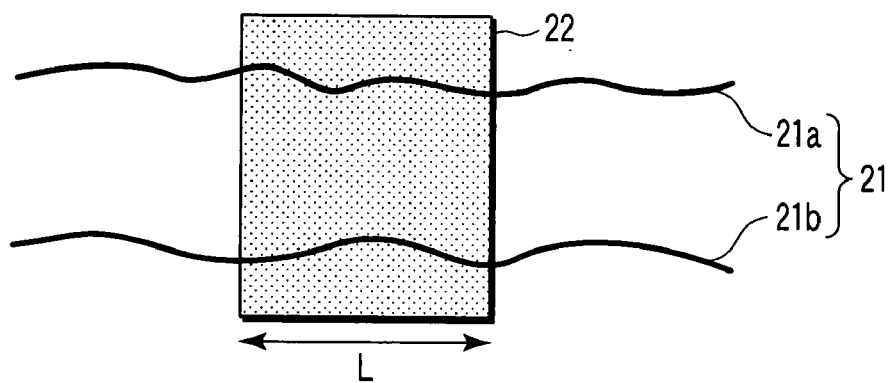
FIG. 3 is a view schematically showing an edge profile of a mask pattern and an ROI according to the embodiment of the invention.

Then, the dimension of the mask pattern in the ROI (measurement area; preset area) is calculated based on the edge profile acquired by the image analyzing unit 17 (S17). FIG. 3 is a view schematically showing an edge profile 21 of the mask pattern and an ROI 22. The dimension (pattern width) of the mask pattern is calculated as an average distance (average dimension) between opposed edge profiles 21a and 21b. The ROIs are set in a plurality of areas on the photomask and the dimension of the pattern is calculated for each ROI.

Figure 4:
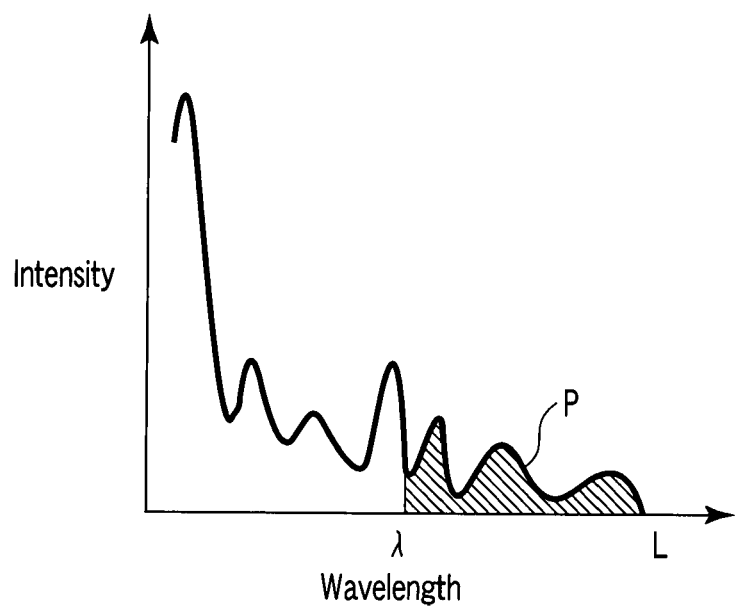
FIG. 4 is a diagram showing the result of frequency analysis of the edge profile according to the embodiment of the invention.

Next, the edge profile 21 in the ROI 22 is subjected to frequency analysis to acquire the intensity distribution of the frequency components (S18). FIG. 4 is a diagram showing the result of frequency analysis of the edge profile 21. In this case, the wavelength is plotted instead of the frequency on the abscissa. The ordinate indicates the intensity (energy). Further, L indicates the ROI width and X indicates the threshold wavelength corresponding to the threshold frequency fth (preset frequency).

A portion of a frequency lower than the threshold frequency fth is extracted from the intensity distribution of the frequency components (S19). In FIG. 4, since the abscissa indicates the wavelength, a portion of the wavelength larger than the threshold wavelength λ is extracted. As is already described before, the roughness with the long period (the roughness with the low frequency component) is transferred onto the wafer, but the roughness with the short period (the roughness with the high frequency component) is not transferred onto the wafer. The roughness with the long period to be transferred may exert a bad influence on the device characteristic. Therefore, information relating to a portion P with the wavelength larger than the threshold wavelength λ is used to evaluate the photomask. For example, the area of the portion P shown in FIG. 4 is used as an evaluation value and it is supposed that the evaluation standard is satisfied when the area of the portion P is smaller than the preset area.

After this, whether the photomask is good or not is determined by use of the information relating to the roughness and pattern dimension acquired for each ROI as described above (S20). Specifically, whether the photomask is good or not is determined based on the average value of the pattern dimensions, a variation (dispersion) in the pattern dimension and the area of the portion P shown in FIG. 4.

As described above, in the present embodiment, a portion of a frequency lower than the threshold frequency fth is extracted from the intensity distribution of the frequency components and the size of the extracted portion is used as one of the evaluation items of the photomask. Thus, it is possible to adequately evaluate the roughness with the long period which exerts a bad influence on the device characteristic. Further, since the roughness of the pattern edge is thus evaluated, the ROI width can be set to a sufficiently large value. That is, as is already described before, if the ROI width is small, the pattern dimension cannot be precisely measured due to the edge roughness with the long period and a variation in the pattern dimension in the mask cannot be precisely evaluated. In the present embodiment, since the ROI width can be set to a sufficiently large value, the pattern dimension can be precisely measured. As described above, in the present embodiment, the pattern dimension can be adequately evaluated and the roughness of the pattern edge can be adequately evaluated.

In the embodiment described above, when the edge profile of the mask pattern is acquired, light is applied onto the photomask. However, it is possible to apply energy waves other than light. For example, it is possible to use an electron beam. Further, when light is used as the energy wave, transmission light, reflected light or scattered light can be used as the response wave from the photomask. When the electron beam is used as the energy wave, scattering electrons or secondary electrons can be used as the response wave from the photomask.

Figure 5:
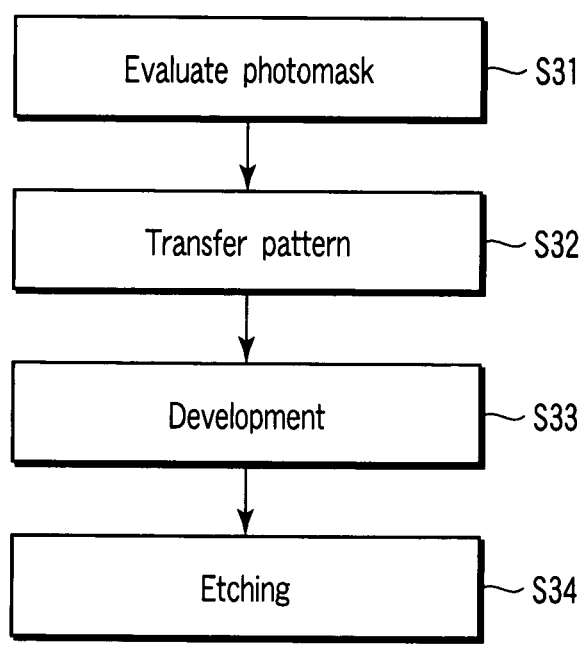
FIG. 5 is a flowchart for illustrating a manufacturing method of a semiconductor device according to an embodiment of the invention.

The evaluation method described in the above embodiment can be applied to a manufacturing method of a semiconductor device. FIG. 5 is a flowchart for schematically illustrating a manufacturing method of a semiconductor device.

First, a photomask is evaluated by use of the method of the above embodiment (S31). Then, a pattern on the photomask which is determined to be good is transferred onto the photoresist on a semiconductor wafer (S32). Further, a photoresist pattern is formed by developing the photoresist (S33). Then, an etching process is performed to form a pattern on the semiconductor wafer with the photoresist pattern used as a mask (S34).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask evaluation method comprising:
applying energy waves to a photomask having a to-be-measured pattern;
detecting a response wave from the photomask;
acquiring an edge profile of the to-be-measured pattern based on the response wave;
acquiring dimension of that portion of the to-be-measured pattern which lies in a preset area, based on the edge profile;
subjecting that portion of the edge profile which lies in the preset area to frequency analysis to acquire intensity distribution of frequency components; and
extracting a portion with a frequency lower than a preset frequency from the intensity distribution.

2. The method according to claim 1, wherein frequency components lower than the preset frequency are transferred onto a wafer by photolithography and frequency components higher than the preset frequency are not transferred onto the wafer by photolithography.

3. The method according to claim 1, further comprising determining whether the photomask is good based on the acquired dimension and the extracted portion from the intensity distribution.

4. The method according to claim 1, wherein the energy wave is light.

5. The method according to claim 4, wherein the response wave from the photomask is one of transmission light, reflected light and scattered light.

6. The method according to claim 1, wherein the energy wave is an electron beam.

7. The method according to claim 6, wherein the response wave from the photomask is one of scattering electrons and secondary electrons.

8. The method according to claim 1, wherein the dimension includes pattern width.

9. The method according to claim 1, wherein a plurality of the preset areas are defined on the photomask.

10. The method according to claim 1, wherein acquiring the dimension includes acquiring an average value of the dimensions and dispersion in the dimension.

11. The method according to claim 1, wherein extracting the portion with the frequency lower than the preset frequency includes extracting wavelength larger than preset wavelength.

12. A manufacturing method of a semiconductor device comprising:
preparing a photomask evaluated by the method according to claim 1, and
transferring a pattern on the photomask onto photoresist on a wafer.

* * * * *